United States Patent
Kandala et al.

(10) Patent No.: US 10,069,487 B1
(45) Date of Patent: Sep. 4, 2018

(54) DELAY CHAIN HAVING SCHMITT TRIGGERS

(71) Applicant: Xilinx, Inc., San Jose, CA (US)

(72) Inventors: Anil Kumar Kandala, Hyderabad (IN); Santosh Yachareni, Hyderabad (IN); Sandeep Vundavalli, Secunderabad (IN); Vijay Kumar Koganti, Hyderabad (IN); Golla V S R K Prasad, Guntur (IN); Udaya Kumar Bobbili, Karim Nagar (IN)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/463,824

(22) Filed: Mar. 20, 2017

(51) Int. Cl.
*H03H 11/26* (2006.01)
*H03K 3/3565* (2006.01)
*H03K 19/173* (2006.01)
*H03K 19/177* (2006.01)

(52) U.S. Cl.
CPC ....... *H03K 3/3565* (2013.01); *H03K 19/1737* (2013.01); *H03K 19/17724* (2013.01); *H03K 19/17744* (2013.01)

(58) Field of Classification Search
CPC ............. H03K 3/3565; H03K 19/1737; H03K 19/17724; H03K 19/17744
USPC ...................................................... 327/288
See application file for complete search history.

(56) References Cited

U.S. PATENT DOCUMENTS

| | | | | |
|---|---|---|---|---|
| 9,099,027 | B2* | 8/2015 | Tomita | G09G 3/20 |
| 2002/0169994 | A1* | 11/2002 | Yang | G06F 1/10 |
| | | | | 713/503 |
| 2005/0219919 | A1* | 10/2005 | Ivanov | G11C 7/22 |
| | | | | 365/194 |
| 2007/0061536 | A1* | 3/2007 | Ivanov | G11C 7/1006 |
| | | | | 711/167 |
| 2007/0182474 | A1* | 8/2007 | Von Thun | H03H 11/26 |
| | | | | 327/276 |
| 2012/0081151 | A1* | 4/2012 | Tomita | H03H 11/265 |
| | | | | 326/121 |
| 2016/0094230 | A1* | 3/2016 | Herbeck | H03L 7/0818 |
| | | | | 327/158 |

OTHER PUBLICATIONS

Kirthanaa, A. et al., "Delay Analysis of CMOS Schmitt Trigger Circuits, International Journal of Advanced Research in Computer Science and Software Engineering," Nov. 2015, pp. 106-110, vol. 5, Issue 11, Advanced Research International Publication House, Uttar Pradesh, India.

* cited by examiner

*Primary Examiner* — Ryan Jager
(74) *Attorney, Agent, or Firm* — LeRoy D. Mauna

(57) ABSTRACT

A disclosed delay circuit includes a plurality of Schmitt triggers that are serially coupled. A first Schmitt trigger of the plurality of Schmitt triggers is configured to receive an input signal. An output control circuit is coupled to receive output signals of two or more Schmitt triggers of the plurality of Schmitt triggers, the output control circuit configured to select a signal from one of the one or more Schmitt triggers as an output signal. The output signal is a delayed version of the input signal.

14 Claims, 5 Drawing Sheets

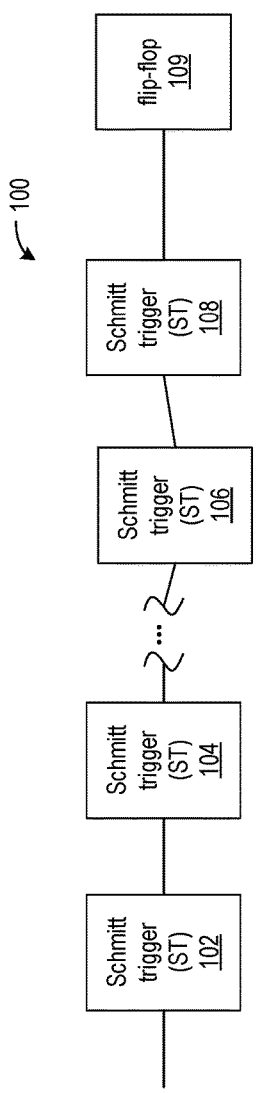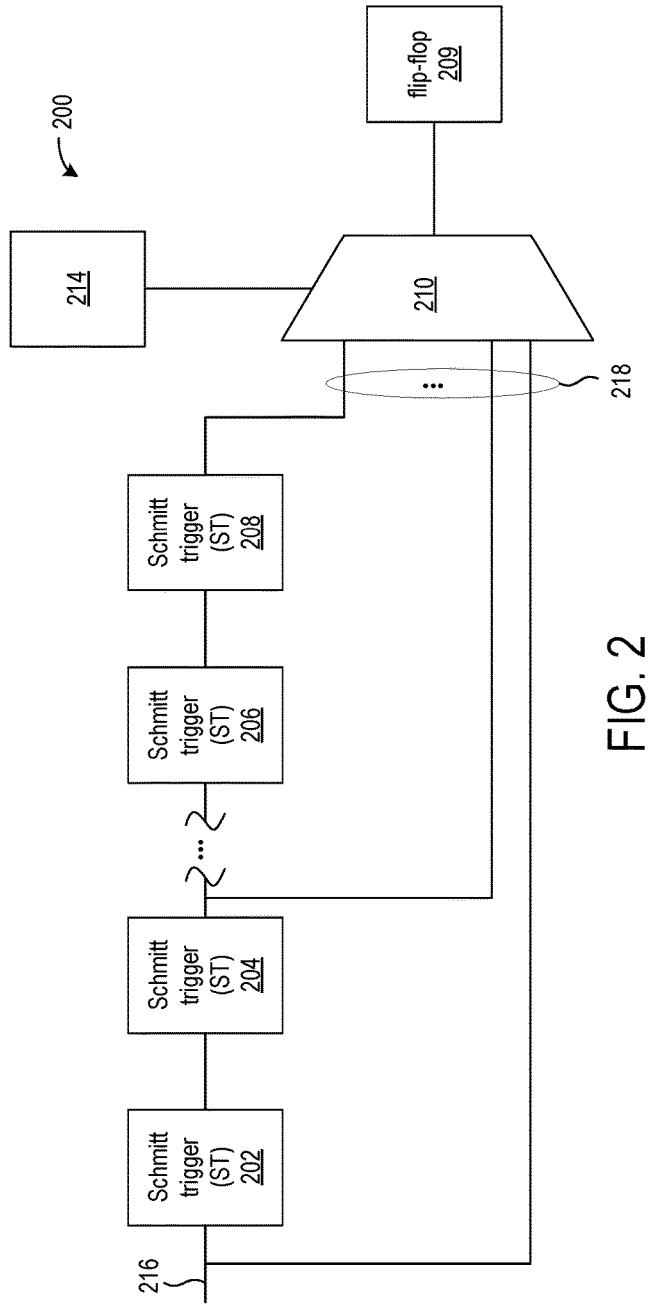

US 10,069,487 B1

DELAY CHAIN HAVING SCHMITT TRIGGERS

TECHNICAL FIELD

The disclosure generally relates to delay circuitry having Schmitt triggers.

BACKGROUND

Programmable delay circuits are often used in integrated circuit applications to fix hold time issues that are discovered in both pre-silicon and post-silicon manufacturing stages. With advances in integrated circuit (IC) technology, such as the use of fin field effect transistors (FINFETs), however, the observed delay of each individual CMOS inverter in a delay circuit is decreasing, and greater variations are seen in the delay of the CMOS inverters. With the decrease in observed delay and the increase in variability, more delay elements are required to provide suitable delay options. The increased number of delay elements can increase the circuit area occupied by the delay circuitry by a factor of two or more.

SUMMARY

A disclosed implementation of a delay circuit includes a plurality of Schmitt triggers that are serially coupled. A first Schmitt trigger of the plurality of Schmitt triggers is configured to receive an input signal. An output control circuit is coupled to receive output signals of two or more Schmitt triggers of the plurality of Schmitt triggers. The output control circuit is configured to select a signal from one of the two or more Schmitt triggers as an output signal. The output signal is a delayed version of the input signal.

Another disclosed implementation of a delay circuit includes a plurality of Schmitt triggers that are serially coupled. A first Schmitt trigger of the plurality of Schmitt triggers is configured to receive an input signal. Each Schmitt trigger of the plurality of Schmitt triggers includes a first sub-circuit and a second sub-circuit. The first sub-circuit includes a pair of PMOS transistors and a pair of NMOS transistors serially connected between a supply voltage and ground and an output node connected between the pair of PMOS transistors and the pair of NMOS transistors. The PMOS transistors and NMOS transistors have gates coupled to receive the same signal at an input node. The second sub-circuit includes another PMOS transistor and another NMOS transistor. The other PMOS transistor is connected between the pair of PMOS transistors and ground, the other NMOS transistor is connected between the pair of NMOS transistors and the supply voltage, and a gate of the other PMOS transistor and a gate of the other NMOS transistor are directly connected to the output node. The output node of each Schmitt trigger, except a last Schmitt trigger of the plurality of Schmitt triggers, is connected to the input node of a next serially coupled Schmitt trigger of the plurality of Schmitt triggers.

Another disclosed implementation of a delay circuit includes a plurality of Schmitt triggers that are serially coupled. A first Schmitt trigger of the plurality of Schmitt triggers is configured to receive an input signal. Each Schmitt trigger of the plurality of Schmitt triggers includes a first sub-circuit and a second sub-circuit. The first sub-circuit includes a pair of PMOS transistors and a pair of NMOS transistors serially connected between supply voltage and ground, and an output node connected between the pair of PMOS transistors and the pair of NMOS transistors. The PMOS transistors and NMOS transistors have gates coupled to receive the same signal at an input node. The second sub-circuit includes another PMOS transistor and another NMOS transistor. The other PMOS transistor is coupled between the pair of PMOS transistors and ground, the other NMOS transistor is coupled between the pair of NMOS transistors and the supply voltage, and a gate of the other PMOS transistor is connected to a gate of the other NMOS transistor. The output node of each Schmitt trigger except a last Schmitt trigger of the plurality of Schmitt triggers is connected to the input node of a next serially coupled Schmitt trigger of the plurality of Schmitt triggers. The gate of the other PMOS transistor and the gate of the other NMOS transistor of the at least one Schmitt trigger are coupled to receive a signal from the output node of the one other Schmitt trigger.

Other features will be recognized from consideration of the Detailed Description and Claims, which follow.

BRIEF DESCRIPTION OF THE DRAWINGS

Various aspects and features of the methods and circuits will become apparent upon review of the following detailed description and upon reference to the drawings in which:

FIG. 1 shows a delay circuit having serially connected Schmitt triggers;

FIG. 2 shows a delay circuit having serially connected Schmitt triggers and control circuitry for selecting the output signal;

DETAILED DESCRIPTION

Figure 3:
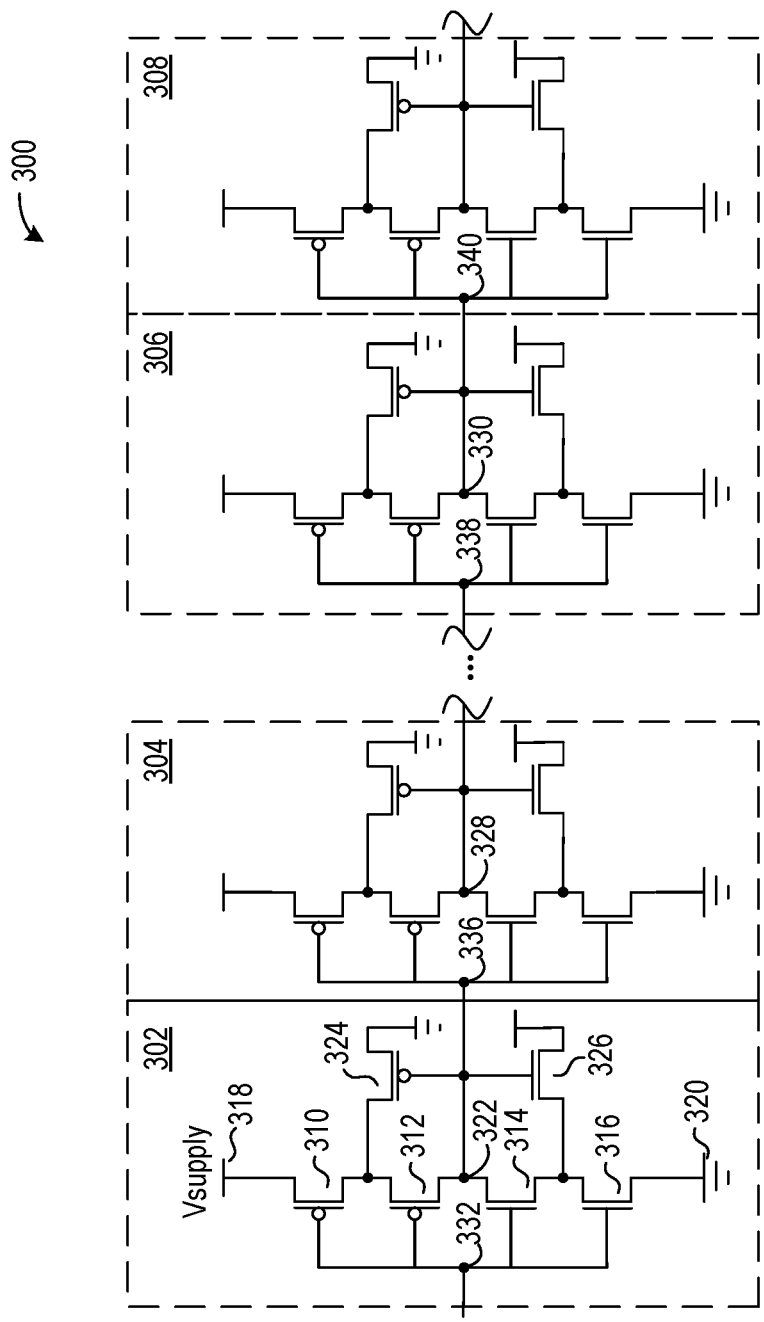
FIG. 3 shows a delay circuit that includes a chain of serially connected Schmitt triggers.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

In a departure from prior approaches in which CMOS inverters are used to implement a delay circuit, the disclosed approaches employ a chain of Schmitt triggers as elements in a delay chain. Schmitt triggers are conventionally used to remove noise from signals in digital circuits, and are often used to address issues resulting from mechanical contact bounce. In the disclosed approaches, multiple Schmitt triggers are serially connected to effect a desired delay of an input signal.

The disclosed Schmitt trigger delay chains provide greater delay while reducing the area requirements as compared to a CMOS inverter delay chain. The delay provided by one Schmitt trigger is much greater than the delay provided by the number of CMOS inverters having the same number of transistors as the one Schmitt trigger. A Schmitt trigger delay chain can thereby provide a greater delay while occupying less area than a CMOS inverter delay chain. A Schmitt trigger delay chain also significantly reduces the number of delay elements needed to fix larger hold time violations, thereby reducing the area occupied by delay chain circuitry.

In one implementation, a delay circuit includes multiple, serially coupled Schmitt triggers. An output control circuit can be coupled to receive output signals of one or more of the Schmitt triggers and select an output signal from one of the Schmitt triggers. The selected output signal is a delayed version of the input signal to the first Schmitt trigger in the chain of Schmitt triggers.

In another implementation, a delay circuit includes multiple, serially coupled Schmitt triggers, and the chain of Schmitt triggers has one or more feedback paths from later stages of the chain to earlier stages of the chain. Each feedback path increases the delay through the chain. An optional output control circuit can be coupled to receive output signals of one or more of the Schmitt triggers and select an output signal from one of the Schmitt triggers. The selected output signal is a delayed version of the input signal to the first Schmitt trigger in the chain of Schmitt triggers.

FIG. 1 shows a delay circuit 100 having serially connected Schmitt triggers. The delay chain includes Schmitt triggers 102, 104, . . . 106, and 108. The number of Schmitt triggers in the delay chain can vary according to application requirements. The first Schmitt trigger 102 in the chain is coupled to receive an input signal, which can be a clock signal or a data signal. Each Schmitt trigger in the chain, with exception of the first Schmitt trigger 102, is coupled to receive the output signal form the preceding Schmitt trigger in the chain. For example, the second Schmitt trigger 104 is coupled to receive the output signal from the first Schmitt trigger 102. In an exemplary implementation, the output signal from each Schmitt trigger is an inverted, delayed version of the input signal to that Schmitt trigger. In an exemplary application, the output signal from the last Schmitt trigger 108 in the chain can be connected to the clock pin or data pin of a flip-flop 109.

FIG. 2 shows a delay circuit 200 having serially connected Schmitt triggers and control circuitry for selecting the output signal. The delay chain includes Schmitt triggers 202, 204, . . . 206, and 208. The first Schmitt trigger 202 in the chain is coupled to receive an input signal 216. Each Schmitt trigger in the chain, with the exception of the first Schmitt trigger 202, is coupled to receive the output signal from the preceding Schmitt trigger in the chain. For example, the second Schmitt trigger 204 is coupled to receive the output signal from the first Schmitt trigger 202. In an exemplary implementation, the output signal from each Schmitt trigger is an inverted, delayed version of the input signal to that Schmitt trigger.

The delay circuit 200 includes an output control circuit for selecting an output signal from the chain of Schmitt triggers 202, 204, . . . 206, 208. The output control circuit can include multiplexer 210 and memory element 214. The multiplexer 210 inputs the signal 216 and the output signals from one or more of the Schmitt triggers. The multiplexer selects one of the signals 218, and the output signal from the multiplexer 210 is connected to the clock pin or data pin of a flip-flop 209, for example.

In an exemplary implementation, each Schmitt trigger inverts the logic level of the input signal. Thus, the delay circuit 200 includes an even number of Schmitt triggers. Also, in order to provide a delayed version of the input signal 216 having the same logic level as the logic level of the input signal 216, the inputs to the multiplexer are the output signals from the even numbered (i.e., $2^{nd}$, $4^{th}$, $6^{th}$, . . . ) Schmitt triggers in the chain.

The output control circuit can be programmable for selection of a desired one of the input signals to the multiplexer 210 in order to effect a desired amount of delay of the input signal 216. In an exemplary implementation, memory element 214 is a configuration memory cell that can be programmed with a value that causes multiplexer 210 to select one of the signals 218. The memory element 214 can be volatile or non-volatile depending on application requirements.

FIG. 3 shows a delay circuit 300 that includes a chain of serially connected Schmitt triggers. The exemplary delay circuit includes Schmitt triggers 302, 304, . . . 306, and 308, which are delineated by blocks having dashed lines. The number of Schmitt triggers can vary according to application requirements.

Each Schmitt trigger includes a first sub-circuit and a second sub-circuit. The first sub-circuit includes a pair of PMOS transistors and a pair of NMOS transistors serially connected between a supply voltage 318 and ground 320. For example, in Schmitt trigger 302, PMOS transistor 310 is connected to the supply voltage 318, PMOS transistor 312 is serially connected to PMOS transistor 310, NMOS transistor 314 is serially connected to PMOS transistor 312, and NMOS transistor 316 is serially connected between NMOS transistor 314 and ground 320.

The pair of PMOS transistors and pair of NMOS transistors have gates that are coupled to receive the same signal at an input node. For example, the gates of PMOS transistors 310 and 312 and the gates of NMOS transistors 314 and 316 are coupled to receive the input signal at node 332.

Each Schmitt trigger has an output node connected between the pair of PMOS transistors and the pair of NMOS transistors. For example, output node 322 is connected between PMOS transistor 312 and NMOS transistor 314.

The second sub-circuit of each Schmitt trigger includes a PMOS transistor and an NMOS transistor. For example, the second sub-circuit of Schmitt trigger 302 includes PMOS transistor 324 and NMOS transistor 326. PMOS transistor 324 is coupled between transistors 310 and 312 and ground. NMOS transistor 326 is coupled between NMOS transistors 314 and 316 and the supply voltage. The gates of PMOS transistor 324 and NMOS transistor 326 are coupled to receive the signal from the output node 322.

The output node of each Schmitt trigger, with the exception of the last Schmitt trigger 308 in the chain, is connected to the input node of the next Schmitt trigger in the chain. For example, the output node 322 of Schmitt trigger 302 is connected to the input node 336 of Schmitt trigger 304; the output node 328 of Schmitt trigger 304 is connected to the input node (not shown) of the next Schmitt trigger (not shown) in the chain; the output node (not shown) of the Schmitt trigger (not shown) that precedes Schmitt trigger 306 is connected to the input node 338 of Schmitt trigger 306; and the output node 330 of Schmitt trigger 306 is connected to the input node 340 of Schmitt trigger 308.

Figure 4:
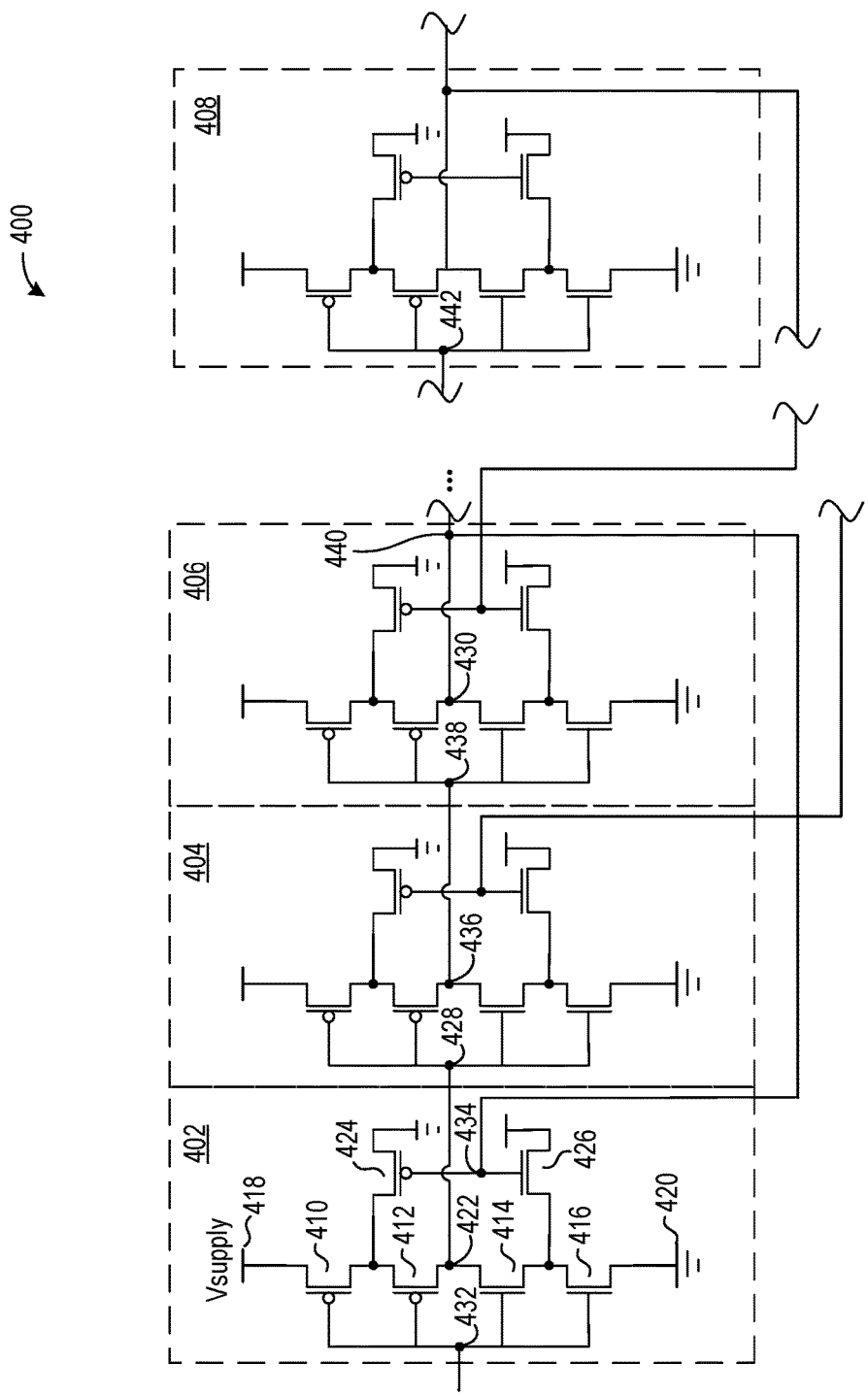
FIG. 4 shows a delay circuit that includes a chain of serially connected Schmitt triggers.

FIG. 4 shows a delay circuit 400 that includes a chain of serially connected Schmitt triggers. The exemplary delay circuit includes Schmitt triggers 402, 404, . . . 406, and 408, which are delineated by blocks having dashed lines. The number of Schmitt triggers can vary according to application requirements. In the delay circuit 400, multiple ones of the Schmitt triggers are coupled to receive a feedback signal from other ones of the Schmitt triggers. Though multiple ones of the Schmitt triggers receive feedback in delay circuit 400, the number may vary from one to many according to application requirements. The feedback is the output signal from one of the Schmitt triggers to another of the Schmitt triggers. The output signal that is fed back from one Schmitt trigger to another Schmitt trigger has the same logic level as the output signal of the other Schmitt trigger.

Each of Schmitt triggers 402, 404, 406, . . . 408 includes a first sub-circuit and a second sub-circuit. The first sub-circuit includes a pair of PMOS transistors and a pair of NMOS transistors serially connected between a supply voltage 418 and ground 420. For example, in Schmitt trigger 402, PMOS transistor 410 is connected to the supply voltage 418, PMOS transistor 412 is serially connected to PMOS transistor 410, NMOS transistor 414 is serially connected to PMOS transistor 412, and NMOS transistor 416 is serially connected between NMOS transistor 414 and ground 420.

The pair of PMOS transistors and pair of NMOS transistors have gates that are coupled to receive the same signal at an input node. For example, the gates of PMOS transistors 410 and 412 and the gates of NMOS transistors 414 and 416 are coupled to receive the input signal at node 432.

Each Schmitt trigger has an output node connected between the pair of PMOS transistors and the pair of NMOS transistors. For example, output node 422 is connected between PMOS transistor 412 and NMOS transistor 414.

The second sub-circuit of each Schmitt trigger includes a PMOS transistor and an NMOS transistor. For example, the second sub-circuit of Schmitt trigger 402 includes PMOS transistor 424 and NMOS transistor 426. PMOS transistor 424 is coupled between transistors 410 and 412 and ground. NMOS transistor 426 is coupled between NMOS transistors 414 and 416 and the supply voltage. The gates of PMOS transistor 424 and NMOS transistor 426 are coupled to receive the feedback signal at node 434

The output node of each Schmitt trigger, with the exception of the last Schmitt trigger 408 in the chain, is connected to the input node of the next Schmitt trigger in the chain. For example, the output node 422 of Schmitt trigger 402 is connected to the input node 428 of Schmitt trigger 404; the output node 436 of Schmitt trigger 404 is connected to the input node 438 of Schmitt trigger 406; the output node 430 of Schmitt trigger 406 is connected to the input node (not shown) of the next Schmitt trigger (not shown) in the chain; and the output node (not shown) of the Schmitt trigger (not shown) that precedes Schmitt trigger 408 is connected to the input node 442 of Schmitt trigger 408.

One or more of the of the Schmitt triggers in the delay circuit 400 can be connected to receive a feedback signal from another one of the Schmitt triggers in the delay chain. The output signal that is fed back from one Schmitt trigger to another Schmitt trigger has the same logic level as the output signal of the other Schmitt trigger. Thus, a Schmitt trigger can receive a feedback signal from any other Schmitt trigger in the delay circuit as long the feedback signal has the same logic level as the logic level of the output signal from the Schmitt trigger receiving the feedback signal. In the exemplary delay chain, the gates of PMOS transistor 424 and NMOS transistor in Schmitt trigger 402 are coupled to receive the output signal at node 440 from Schmitt trigger 406. Schmitt triggers 404 and 406 are also coupled to receive feedback from other Schmitt triggers (not shown) in the delay circuit.

Figure 5:
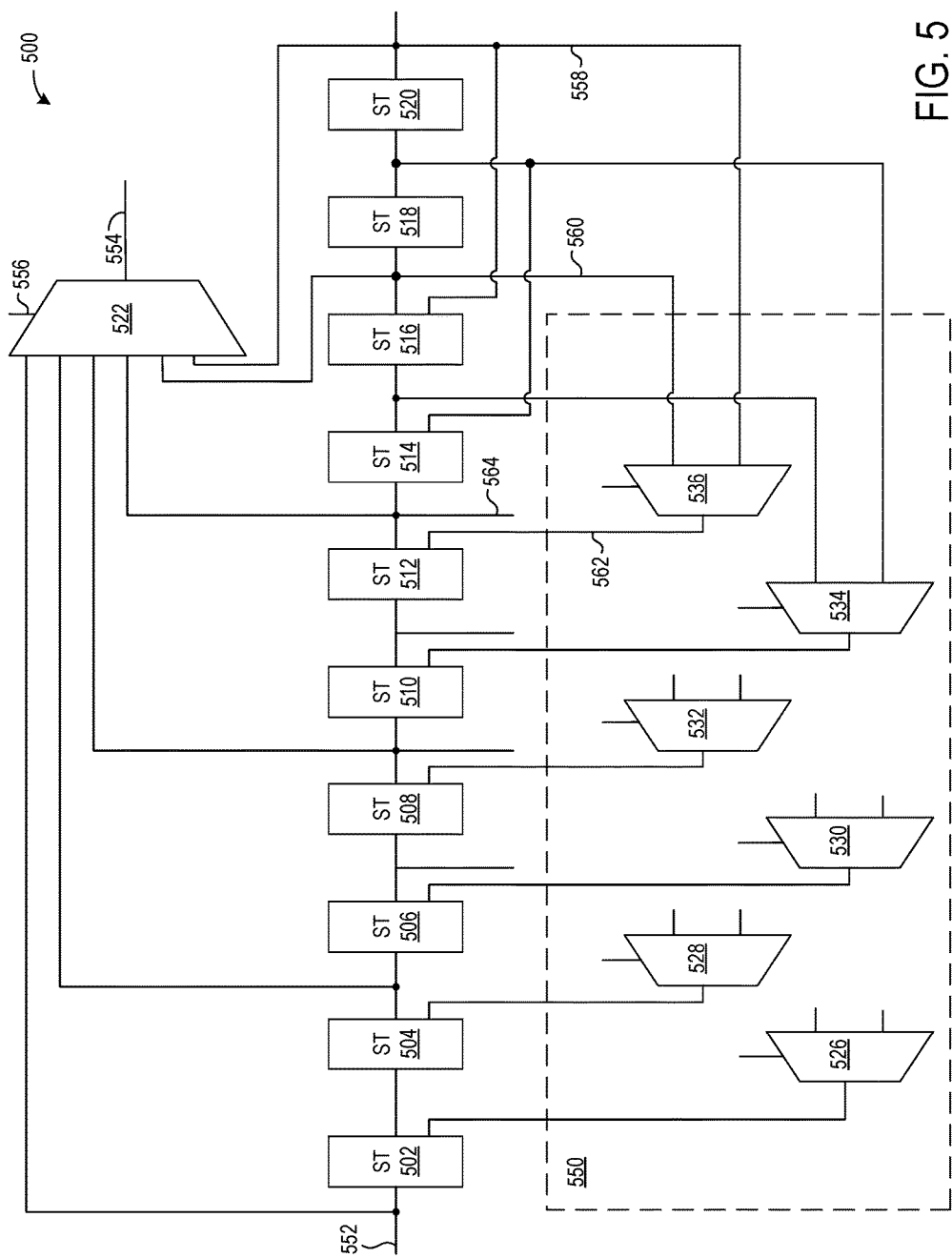
FIG. 5 shows an exemplary delay circuit having multiple Schmitt triggers as delay elements, selectable outputs for a desired amount of delay, and multiple feedback signals from later stage Schmitt triggers to earlier stage Schmitt triggers.

FIG. 5 shows an exemplary delay circuit 500 having multiple Schmitt triggers as delay elements, selectable outputs for a desired amount of delay, and multiple feedback signals from later stage Schmitt triggers to earlier stage Schmitt triggers. Depending on application requirements, in alternative implementations fewer Schmitt triggers may be employed, fewer output signals from the Schmitt triggers can be connected to the multiplexer 522 than are shown, and fewer feedback signals than are shown can be employed.

The exemplary delay circuit 500 includes serially connected Schmitt triggers 502, 504, 506, 508, 510, 512, 514, 516, 518, and 520. The input signal 552 and output signals from Schmitt triggers 504, 508, 512, 516, and 520 are coupled to the input pins of multiplexer 522. The multiplexer selects one of the input signals as the output signal 554 of the delay circuit in response to the state of the control signal 556.

The exemplary delay circuit 500 further includes a feedback control circuit 550 that is coupled to receive output signals from two or more of the Schmitt triggers 502, 504, 506, 508, 510, 512, 514, 516, 518, and 520. The feedback control circuit is configured to select one of the output signals from the Schmitt triggers and provide the selected one of the output signals as a feedback signal to another one of Schmitt triggers that is serially coupled before the Schmitt triggers providing the feedback signals in the delay circuit. The feedback control circuit includes multiplexers 526, 528, 530, 532, 534, and 536 for making the selections. For example, the feedback control circuit inputs the output signals 558 and 560 from Schmitt triggers 520 and 516, respectively. Multiplexer 536 selects one of the two feedback signals as the feedback signal 562 for input to the Schmitt trigger 512. The feedback signal 562 is connected to the Schmitt trigger 512 in a manner similar to the connection at node 434 of Schmitt trigger 402 in FIG. 4.

Multiplexers 526, 528, 530, 532 and 534 similarly select feedback signals for Schmitt triggers 502, 504, 506, 508, and 510, respectively. Depending on application requirements, alternative implementations need not have each Schmitt trigger other than the last Schmitt trigger receive a feedback signal. For example, an implementation can have only one of the Schmitt triggers receiving a feedback signal. Another implementation can have the feedback signal selected by a multiplexer input to more than one of the Schmitt triggers. For example, another implementation could have the feedback signal 562 input to Schmitt trigger 512 and to Schmitt trigger 508. Another implementation can have a multiplexer select from more than two signals. For example, multiplexer 532 could select the feedback signal from signals 558, 560, and 564.

The selection of an output signal by multiplexer 522 and selection of feedback signals by multiplexers 526, 528, 530, 532, 534 and 536 can be programmable in order to effect a desired amount of delay of the input signal 552. The control may be provided by bused control signals or by configuration memory cells programmed with desired values.

Figure 6:
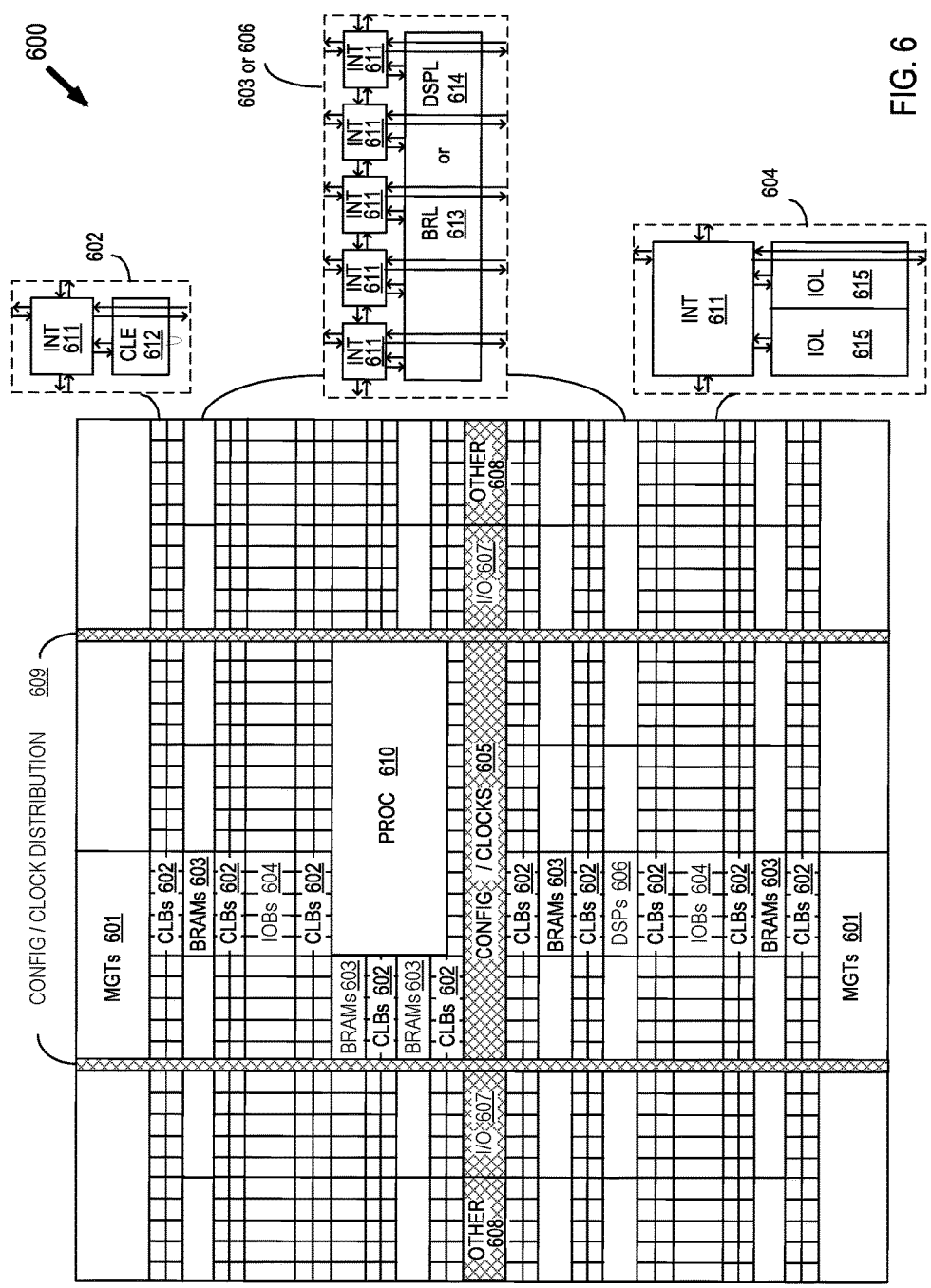
FIG. 6 shows a programmable integrated circuit (IC) on which the disclosed circuits and processes may be implemented.

FIG. 6 shows a programmable integrated circuit (IC) 600 on which the disclosed circuits and processes may be implemented. The programmable IC may also be referred to as a System On Chip (SOC) that includes field programmable gate array logic (FPGA) along with other programmable resources. FPGA logic may include several different types of programmable logic blocks in the array. For example, FIG. 6 illustrates programmable IC 600 that includes a large number of different programmable tiles including multi-gigabit transceivers (MGTs) 601, configurable logic blocks (CLBs) 602, random access memory blocks (BRAMs) 603, input/output blocks (IOBs) 604, configuration and clocking logic (CONFIG/CLOCKS) 605, digital signal processing blocks (DSPs) 606, specialized input/output blocks (I/O) 607, for example, clock ports, and other programmable logic 608 such as digital clock managers, analog-to-digital converters, system monitoring logic, and so forth. Some programmable IC having FPGA logic also include dedicated processor blocks (PROC) 610 and internal and external reconfiguration ports (not shown).

In some FPGA logic, each programmable tile includes a programmable interconnect element (INT) 611 having standardized connections to and from a corresponding interconnect element in each adjacent tile. Therefore, the programmable interconnect elements taken together implement the programmable interconnect structure for the illustrated FPGA logic. The programmable interconnect element INT 611 also includes the connections to and from the programmable logic element within the same tile, as shown by the examples included at the top of FIG. 6.

For example, a CLB 602 can include a configurable logic element CLE 612 that can be programmed to implement user logic, plus a single programmable interconnect element INT 611. A BRAM 603 can include a BRAM logic element (BRL) 613 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 606 can include a DSP logic element (DSPL) 614 in addition to an appropriate number of programmable interconnect elements. An 10B 604 can include, for example, two instances of an input/output logic element (IOL) 615 in addition to one instance of the programmable interconnect element INT 611. As will be clear to those of skill in the art, the actual I/O bond pads connected, for example, to the I/O logic element 615, are manufactured using metal layered above the various illustrated logic blocks, and typically are not confined to the area of the input/output logic element 615.

In the pictured embodiment, a columnar area near the center of the die (shown shaded in FIG. 6) is used for configuration, clock, and other control logic. Horizontal areas 609 extending from this column are used to distribute the clocks and configuration signals across the breadth of the programmable IC. Note that the references to "columnar" and "horizontal" areas are relative to viewing the drawing in a portrait orientation.

Some programmable ICs utilizing the architecture illustrated in FIG. 6 include additional logic blocks that disrupt the regular columnar structure making up a large part of the programmable IC. The additional logic blocks can be programmable blocks and/or dedicated logic. For example, the processor block PROC 610 shown in FIG. 6 spans several columns of CLBs and BRAMs.

Note that FIG. 6 is intended to illustrate only an exemplary programmable IC architecture. The numbers of logic blocks in a column, the relative widths of the columns, the number and order of columns, the types of logic blocks included in the columns, the relative sizes of the logic blocks, and the interconnect/logic implementations included at the top of FIG. 6 are purely exemplary. For example, in an actual programmable IC, more than one adjacent column of CLBs is typically included wherever the CLBs appear, to facilitate the efficient implementation of user logic.

Though aspects and features may in some cases be described in individual figures, it will be appreciated that features from one figure can be combined with features of another figure even though the combination is not explicitly shown or explicitly described as a combination.

The disclosed circuitry is thought to be applicable to a variety of applications having delay circuits. Other aspects and features will be apparent to those skilled in the art from consideration of the specification. It is intended that the specification and drawings be considered as examples only, with a true scope of the invention being indicated by the following claims.

What is claimed is:

1. A delay circuit, comprising:
   a plurality of Schmitt triggers that are serially coupled, a first Schmitt trigger of the plurality of Schmitt triggers configured to receive an input signal; and
   an output control circuit coupled to receive output signals of two or more Schmitt triggers of the plurality of Schmitt triggers, the output control circuit configured to select a signal from one of the two or more Schmitt triggers as an output signal, wherein the output signal is a delayed version of the input signal,
   wherein at least one Schmitt trigger of the plurality of Schmitt triggers is coupled to receive feedback of an output signal from one other Schmitt trigger of the plurality of Schmitt triggers.

2. The delay circuit of claim 1, wherein the output control circuit is further coupled to receive the input signal and further configured to select as the output signal the input signal or the signal from one of the two or more Schmitt triggers.

3. The delay circuit of claim 1, wherein the output signal of the at least one Schmitt trigger has a same logic level as the output signal of the output signal fed-back from the one other Schmitt trigger.

4. The delay circuit of claim 1, further comprising a feedback control circuit coupled to receive output signals from at least two Schmitt triggers of the plurality of Schmitt triggers, wherein the feedback control circuit is configured to select one of the output signals from the at least two Schmitt triggers and provide the selected one of the output signals as a feedback signal to at least one Schmitt trigger that is serially coupled before the at least two Schmitt triggers of the plurality of Schmitt triggers.

5. The delay circuit of claim 4, wherein the feedback control circuit includes a memory cell, and the feedback control circuit is further configured to select the one of the output signals in response to a state of the memory cell.

6. The delay circuit of claim 4, wherein:
   each Schmitt trigger of the plurality of Schmitt triggers includes a first sub-circuit and a second sub-circuit;
   the first sub-circuit includes a pair of PMOS transistors and a pair of NMOS transistors serially connected between a supply voltage and ground and an output node connected between the pair of PMOS transistors and the pair of NMOS transistors, and the PMOS transistors and NMOS transistors have gates coupled to receive a same signal at an input node;
   the second sub-circuit includes another PMOS transistor and another NMOS transistor, the other PMOS transistor is coupled between the pair of PMOS transistors and ground, the other NMOS transistor is coupled between the pair of NMOS transistors and the supply voltage, and a gate of the other PMOS transistor is connected to a gate of the other NMOS transistor;
   the output node of each Schmitt trigger except a last Schmitt trigger of the plurality of Schmitt triggers is connected to the input node of a next serially coupled Schmitt trigger of the plurality of Schmitt triggers; and
   the gate of the other PMOS transistor and the gate of the other NMOS transistor of the at least one Schmitt trigger are coupled to receive the selected one of the output signals from the feedback control circuit.

7. The delay circuit of claim 1, wherein the input signal is a clock signal.

8. The delay circuit of claim 1, further comprising a flip-flop, wherein the input signal is a clock signal and the flip-flop is coupled to receive the output signal from the output control circuit.

9. The delay circuit of claim 1, further comprising a memory cell coupled to the output control circuit, wherein the output control circuit is further configured to select the output signal in response to a state of the memory cell.

10. The delay circuit of claim 1, wherein:
the output control circuit includes a first memory cell, and the output control circuit is further configured to select the output signal in response to a state of the first memory cell; and
the feedback control circuit includes a second memory cell, and the feedback control circuit is further configured to select the one of the output signals in response to a state of the memory cell.

11. A delay circuit, comprising:
a plurality of Schmitt triggers that are serially coupled, a first Schmitt trigger of the plurality of Schmitt triggers configured to receive an input signal, wherein:
each Schmitt trigger of the plurality of Schmitt triggers includes a first sub-circuit and a second sub-circuit;
the first sub-circuit includes a pair of PMOS transistors and a pair of NMOS transistors serially connected between supply voltage and ground and an output node connected between the pair of PMOS transistors and the pair of NMOS transistors, and the PMOS transistors and NMOS transistors have gates coupled to receive a same signal at an input node;
the second sub-circuit includes another PMOS transistor and another NMOS transistor, the other PMOS transistor is coupled between the pair of PMOS transistors and ground, the other NMOS transistor is coupled between the pair of NMOS transistors and the supply voltage, and a gate of the other PMOS transistor is connected to a gate of the other NMOS transistor;
the output node of each Schmitt trigger except a last Schmitt trigger of the plurality of Schmitt triggers is connected to the input node of a next serially coupled Schmitt trigger of the plurality of Schmitt triggers; and
the gate of the other PMOS transistor and the gate of the other NMOS transistor of at least one Schmitt trigger of the plurality of Schmitt triggers are coupled to receive a signal from the output node of one other Schmitt trigger of the plurality of Schmitt triggers.

12. The delay circuit of claim 11, further comprising an output control circuit coupled to receive the input signal and the signal from the output node of one or more Schmitt triggers of the plurality of Schmitt triggers, the output control circuit configured to select as an output signal one signal from the input signal and the signal from the output node of the one or more Schmitt triggers, wherein the output signal is a delayed version of the input signal.

13. The delay circuit of claim 11, further comprising a feedback control circuit coupled to receive signals output from at least two Schmitt triggers of the plurality of Schmitt triggers, wherein the feedback control circuit is configured to select one of the signals output from the at least two Schmitt triggers and provide the selected one of the signals as a feedback signal to at least one Schmitt trigger that is serially coupled before the at least two Schmitt triggers of the plurality of Schmitt triggers.

14. The delay circuit of claim 13, wherein the feedback control circuit includes a memory cell, and the feedback control circuit is further configured to select the one of the output signals in response to a state of the memory cell.

* * * * *